United States Patent
Chung et al.

(10) Patent No.: US 9,099,329 B2
(45) Date of Patent: Aug. 4, 2015

(54) IN NANOWIRE, DEVICE USING THE SAME AND METHOD OF MANUFACTURING IN NANOWIRE

(71) Applicant: SAMSUNG ELECTRO-MECHANICS CO., LTD., Suwon, Gyunggi-do (KR)

(72) Inventors: Hee Suk Chung, Gyunggi-do (KR); Gyu Seok Kim, Gyunggi-do (KR); Han Wool Kang, Gyunggi-do (KR); Kyung Ho Lee, Gyunggi-do (KR); Mi Yang Kim, Gyunggi-do (KR); Suk Jin Ham, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/782,864

(22) Filed: Mar. 1, 2013

(65) Prior Publication Data

US 2014/0138611 A1 May 22, 2014

(30) Foreign Application Priority Data

Nov. 20, 2012 (KR) ........................ 10-2012-0131645

(51) Int. Cl.
| | |
|---|---|
| H01L 29/06 | (2006.01) |
| H01L 21/033 | (2006.01) |
| B82Y 10/00 | (2011.01) |
| B82Y 40/00 | (2011.01) |
| H01L 29/66 | (2006.01) |
| H01L 29/775 | (2006.01) |
| H01L 21/02 | (2006.01) |
| H01L 33/18 | (2010.01) |

(52) U.S. Cl.
CPC ............ *H01L 29/0676* (2013.01); *B82Y 10/00* (2013.01); *B82Y 40/00* (2013.01); *H01L 29/66469* (2013.01); *H01L 29/775* (2013.01); *H01L 21/0254* (2013.01); *H01L 21/02603* (2013.01); *H01L 21/02614* (2013.01); *H01L 33/18* (2013.01)

(58) Field of Classification Search
CPC .... B82Y 10/00; B82Y 30/00; H01L 29/0676; H01L 21/02645; H01L 29/413
USPC .............................................. 257/9; 438/800
IPC ................................... H01L 29/0676, 21/02603
See application file for complete search history.

(56) References Cited

U.S. PATENT DOCUMENTS

| | | | |
|---|---|---|---|
| 2007/0020950 A1* | 1/2007 | Choi et al. ..................... 438/775 |
| 2008/0217181 A1* | 9/2008 | Hautier et al. .................. 205/77 |
| 2012/0001153 A1 | 1/2012 | Hersee et al. | |

FOREIGN PATENT DOCUMENTS

KR         2009-0008182 A         1/2009

OTHER PUBLICATIONS

Y.X. Liang et al. In situ synthesis of In2O3 nanowires with different diameters from indium film, Applied Physics Letters 88, 193119 (2006).*

*Primary Examiner* — Marcos D Pizarro
(74) *Attorney, Agent, or Firm* — McDermott Will & Emery LLP

(57) ABSTRACT

There is provided an In nanowire including a substrate, an indium thin film formed on the substrate, an insulating film formed on the indium thin film and having at least one through hole through formation of a pattern, and an In nanowire vertically protruded from the indium thin film through the at least one through hole.

20 Claims, 8 Drawing Sheets

IN NANOWIRE, DEVICE USING THE SAME AND METHOD OF MANUFACTURING IN NANOWIRE

CROSS-REFERENCE TO RELATED APPLICATIONS

This application claims the priority of Korean Patent Application No. 10-2012-0131645 filed on Nov. 20, 2012, in the Korean Intellectual Property Office, the disclosure of which is incorporated herein by reference.

BACKGROUND OF THE INVENTION

1. Field of the Invention

The present invention relates to an indium (In) nanowire, a device using the same, and a method of manufacturing an In nanowire.

2. Description of the Related Art

A nanowire is an example of a material within a group of materials collectively known as linear materials that have a nanometer diameter, a length much greater than a diameter thereof, and have a one-dimensional structure on a scale of hundreds of nanometers, micrometers, or millimeters.

The nanowire may be variously applied to micro elements due to a small size thereof, and in particular, may be prevalently applied to devices in a range of various fields, such as optical elements including lasers, transistors, memory devices, and the like, due to the use of electromigration characteristics according to a specific direction or optical characteristics showing a polarization phenomenon.

As a method of manufacturing a nanowire according to the related art, there are provided a chemical vapor deposition method of sequentially using gas-liquid-solid depositions as a type of bottom up approach, a nanowire deposition method using a mold, and the like.

However, in case of the bottom-up approach, a nanowire is manufactured by performing gas-liquid-solid processes on elements to be synthesized and a catalyst by using a transition metal particle having a size of 1 micrometer or less as a catalyst, such that the manufacturing process may be complicated and manufacturing times may be prolonged.

Further, since the transition metal is used as an essential component, the nanowire may be manufactured and then the transition metal may remain on a top or a bottom of the nanowire. In this case, the remaining transition metal may affect a band gap within a semiconductor product to cause elements to malfunction.

In addition, as a method of manufacturing a nanowire, there are provided a method of synthesizing a nanowire using a mold, a method of synthesizing a nanowire using electroplating, a method of synthesizing a nanowire using focused ion beam irradiation, and the like.

However, all of the foregoing methods are based on the bottom up approach, such that it may be difficult to manufacture the nanowire having a relatively large area, and since the number of processes and the synthesis time may increase, the manufacturing time and the manufacturing costs may increase accordingly.

In particular, in manufacturing the In nanowire, the related art discloses a method of irradiating a focused ion beam on a indium gallium nitrogen (InGaN) substrate to selectively grow the In nanowire, by which it may be difficult to manufacture an InGaN substrate that is a base material and has a limitation in manufacturing a nanowire having a large area.

The following Related Art Document does not disclose contents of depositing a buffer layer on a substrate using sputtering equipment and growing a nanowire using heat treatment and only discloses contents of forming a selective growth mask with a plurality of openings on a buffer layer and forming a nanowire through the openings.

RELATED ART DOCUMENT

Korean Patent Laid-Open Publication No. 10-2009-0008182

SUMMARY OF THE INVENTION

An aspect of the present invention provides a method of simply and rapidly manufacturing an In nanowire through a simple process.

According to an aspect of the present invention, there is provided an In nanowire, including: a substrate; an indium thin film formed on the substrate; an insulating film formed on the indium thin film and having at least one through hole through formation of a pattern; and an In nanowire vertically protruded from the indium thin film through the at least one through hole.

According to another aspect of the present invention, there is provided an In nanowire device, including: a substrate; an indium thin film formed on the substrate; an insulating film formed on the indium thin film and having at least one through hole through formation of a pattern; an In nanowire vertically protruded from the indium thin film through the at least one through hole; and an electrode layer formed on the In nanowire.

A thermal expansion coefficient of the indium thin film may be higher than that of the substrate and the insulating film.

The indium thin film may have a thermal expansion coefficient of $2.5 \times 10^{-6}$/° C. through $3.3 \times 10^{-6}$/° C., the substrate may have a thermal expansion coefficient of $3.2 \times 10^{-6}$/° C. through $8.5 \times 10^{-6}$/° C., and the insulating film may be formed of carbon having a thermal expansion coefficient of $3.0 \times 10^{-6}$/° C. through $6.5 \times 10^{-6}$/° C.

A thickness of the indium thin film may be 200 to 400 nm.

The substrate may be a silicon or glass substrate.

The insulating film may be formed of diamond-like carbon.

The In nanowires may include a filler provided therebetween, the filler being formed of an insulating material.

The nanowire device may be configured of a light emitting device for a field effect transistor (FET).

According to another aspect of the present invention, there is provided a method of manufacturing an In nanowire, comprising: forming an indium thin film by depositing the indium thin film on a substrate using sputtering equipment; forming an insulating film on the indium thin film and forming at least one through hole in the insulating film so as to expose the indium thin film by patterning; and growing an In nanowire by heat treating the patterned substrate so as to be vertically protruded from the indium thin film through the at least one through hole.

In the forming of the indium thin film, the indium thin film having a thermal expansion coefficient higher than that of the substrate may be deposited on the substrate by the sputtering equipment to form the indium thin film; in the forming of the insulating film, a material having a thermal expansion coefficient lower than that of the indium thin film may be deposited on the indium thin film to form the insulating film; and in the growing of the In nanowire, the In nanowire may be vertically protruded from the indium thin film through the at least one through hole by a difference in the thermal expansion coefficients between the indium thin film, the substrate, and the insulating film during the heat treatment of the substrate.

The substrate may be a silicon or glass substrate having a thermal expansion coefficient of $3.2\times10^{-6}/°$ C. through $8.5\times10^{-6}/°$ C., the indium thin film may be formed by depositing indium having a thermal expansion coefficient of $2.5\times10^{-6}/°$ C. through $3.3\times10^{-6}/°$ C. on the substrate, and the insulating film may be formed by depositing carbon having a thermal expansion coefficient of $3.0\times10^{-6}/°$ C. through $6.5\times10^{-6}/°$ C. on the indium thin film.

The method of manufacturing an In nanowire may further include: forming a protective layer formed of platinum (Pt) on the insulating film after the insulating film is formed, performing patterning, and removing the protective layer formed on the insulating film so as to expose the insulating film.

In the forming of the insulating film, the insulating film may be formed by being partially polished by a focused ion beam so as to have a pattern of a plurality of through holes.

The patterned substrate may be heat treated within a vacuum chamber.

The method of manufacturing an In nanowire may further include: after the growing of the In nanowire, performing a plasma treatment on the In nanowire.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1A:
FIGS. 1A through 1G are cross-sectional views schematically illustrating a method of manufacturing a nanowire according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

For convenience of explanation, in the present embodiments, a direction in which a substrate is disposed is defined as a downward direction and a direction perpendicular to the downward direction is defined as a left and right direction.

Referring to FIGS. 1A through 1G, a nanowire device according to the embodiment of the present invention may include a substrate 10, an indium thin film 20 formed on the substrate 10, an insulating film 30 formed on the indium thin film 20 and having a plurality of through holes 31, and a plurality of nanowires 40 vertically protruded from a top surface of the indium thin film 20 through the respective through holes 31.

In this configuration, an electrode layer 70 may be formed on respective nanowires 40 to configure the nanowire device.

Further, a filler 60 may be disposed between respective nanowires 40 and may be any insulator and therefore, the present invention is not particularly limited.

Further, materials of the substrate 10 and the insulating film 30 may be selectively formed so that a thermal expansion coefficient of the indium thin film 20 is relatively higher than that of the substrate 10 and the insulating film 30.

For example, the indium thin film 20 has a thermal expansion coefficient of $2.5\times10^{-6}/°$ C. through $3.3\times10^{-6}/°$ C. and the substrate 10 may be formed of a silicon or glass substrate having a thermal expansion coefficient of $3.2\times10^{6}/°$ C. through $8.5\times10^{-6}/°$ C. lower than that of the indium thin film 20.

Further, the insulating film 30 may by formed of a diamond-like carbon. In this case, the thermal expansion coefficient of the diamond-like carbon may have a value of $3.0\times10^{-6}/°$ C. through $6.5\times10^{-6}/°$ C., lower than that of the indium thin film 20.

Figure 2A:
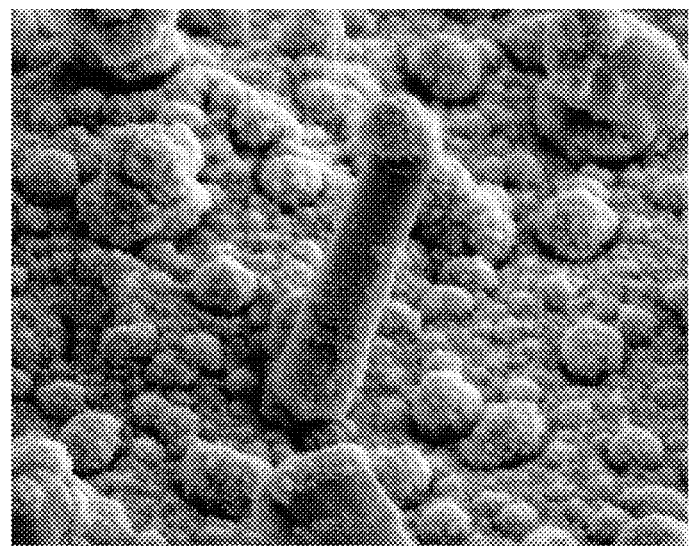
FIG. 2A is a photograph illustrating an insulating film formed of a diamond-like carbon and FIG. 2B is a photograph illustrating an insulating film formed of carbon, rather than the diamond-like carbon, in the method of manufacturing a nanowire according to an embodiment of the present invention.
Figure 2B:
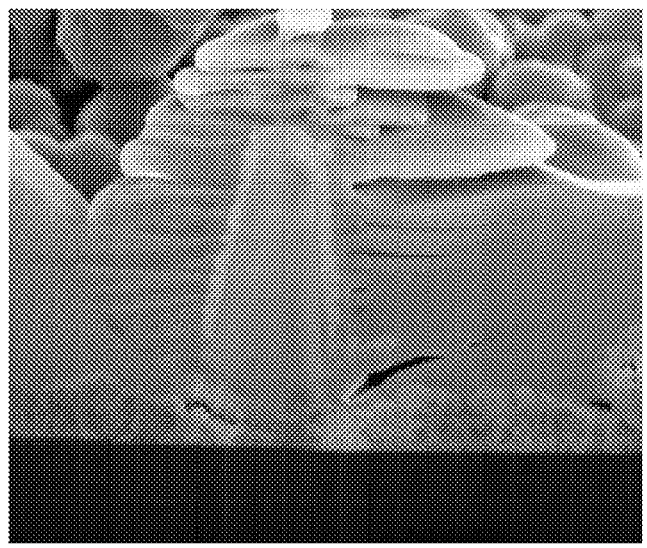

FIG. 2A illustrates the insulating film 30 formed of the diamond-like carbon and FIG. 2B illustrates the insulating film 30 formed of carbon, rather than the diamond-like carbon.

Figure 3A:
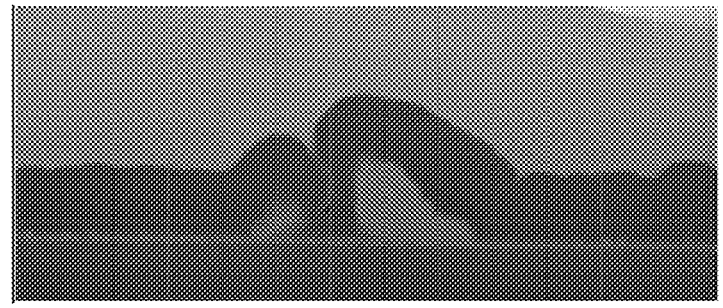
FIGS. 3A and 3B are photographs illustrating a state in which a thickness of an indium thin film is less than 200 nm or exceeds 400 nm, in the method of manufacturing a nanowire according to the embodiment of the present invention.
Figure 3B:
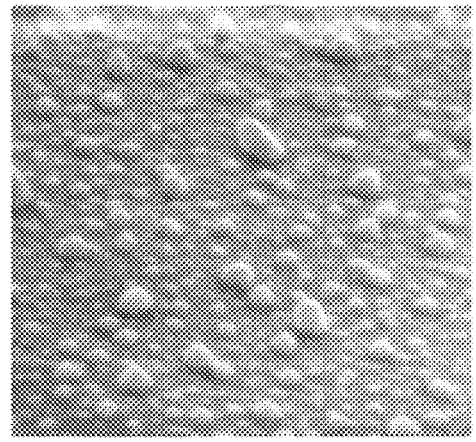

Further, the thickness of the indium thin film 20 may be 200 to 400 nm. Referring to FIGS. 3A and 3B, when the thickness of the indium thin film 20 is less than 200 nm, a minimum thickness sufficient to apply a compression stress to upper and lower substrates during a heat treatment process to be described below is not secured, such that the In nanowire 40 may not be grown properly, and when the thickness of the indium thin film 20 exceeds 400 nm, a bulk volume exceeding the compression stress applied to the upper and lower substrates is expanded, such that it may be difficult to grow the In nanowire 40.

Hereinafter, a method of manufacturing an In nanowire 40 according to the embodiment of the present invention will be described.

Referring to FIG. 1A, the substrate 10 is prepared.

As the substrate 10, various substrates, such as a silicon substrate, a sapphire substrate, a glass substrate, a substrate in which silicon is coated on glass, and the like, may be used, and in the embodiment of the present invention, the silicon substrate may be used, but the present invention is not limited thereto.

Figure 1B:

Next, referring to FIG. 1B, the indium thin film 20 may be formed by depositing indium having a higher thermal expansion coefficient than that of silicon forming the substrate 10 on the substrate 10 using high frequency sputtering equipment, under the conditions of, for example, a radio frequency (RF: ultra high frequency band) power of 10 W and an atmospheric pressure of $5 \times 10^{-3}$ torr. Here, the conditions for forming the indium thin film 20 according to the embodiment of the present invention are not limited to the foregoing conditions.

In this case, the indium thin film 20 may be formed on the silicon substrate 10 so that the thickness thereof is 200 to 400 nm.

When the thickness of the indium thin film 20 is less than 200 nm, a minimum thickness sufficient to apply compression stress to upper and lower substrates during a heat treatment process to be described below is not secured, such that the In nanowire 40 may not be grown properly, and when the thickness of the indium thin film 20 exceeds 400 nm, a bulk volume exceeding the compression stress applied to the upper and lower substrates is expanded, such that it may be difficult to grow the In nanowire 40.

Figure 1C:
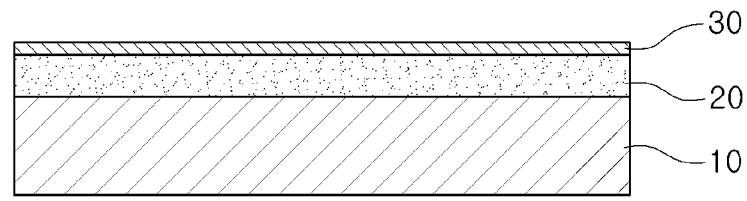

Next, referring to FIG. 1C, the insulating film 30 is formed by depositing materials having a thermal expansion coefficient lower than that of the indium thin film 20, for example, diamond-like carbon, on the indium thin film 20.

In this case, the insulating film 30 may be formed on the indium thin film 20 under the conditions of, for example, a radio frequency (RF: ultra high frequency band) power of 15 W and an atmospheric pressure of $5 \times 10^{-3}$ torr so that the thickness thereof is 20 to 40 nm. Here, the conditions for forming the insulating film 30 according to the embodiment of the present invention are not limited to the foregoing conditions.

FIGS. 2A and 2B illustrate a thin film structure in which the substrate 10, the indium thin film 20, the insulating film 30, and a protective layer 50 are sequentially laminated, prior to being patterned according to the embodiment of the present invention.

Figure 1D:
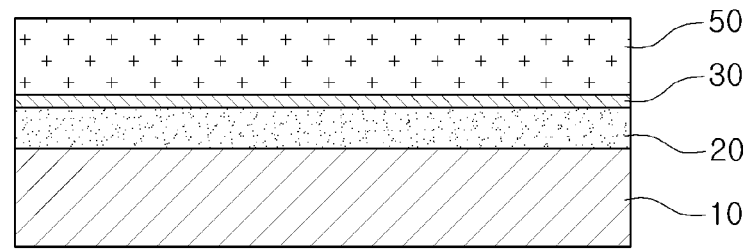

Referring to FIGS. 1D and 2, the protective layer 50 having a predetermined thickness, formed of materials such as platinum Pt, is further formed on the insulating film 30 so as to prevent the insulating film 30 and the indium thin film 20 from being damaged during the patterning to be described below.

Figure 1E:
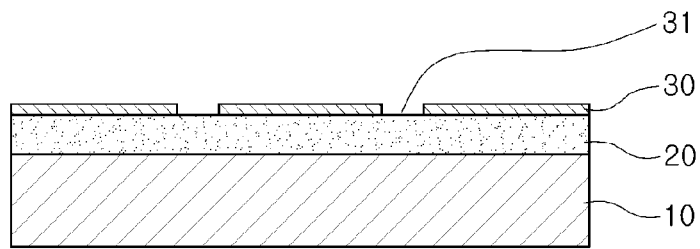

Next, referring to FIG. 1E, the plurality of through holes 31 are formed in the insulating film 30 at a predetermined interval by simultaneously patterning the protective layer 50 and the insulating film 30.

In this case, the protective layer 50 is removed from the insulating film 30 after the patterning is completed, and the top surface of the insulating film 30 may be exposed to the outside.

Further, each through hole 31 may be formed to have a diameter of about 200 to 400 nm but the present invention is not limited thereto.

The patterning may be performed by polishing the protective layer 50 and the insulating film 30 by using, for example, a method such as using focused ion beam, but the present invention is not limited thereto.

In addition, when the interval between the through holes 31 is regularly adjusted during the patterning, a photonic crystal characteristic is shown on the In nanowire 40 to further bring an amplification effect of a specific waveform, and the like.

Figure 4:
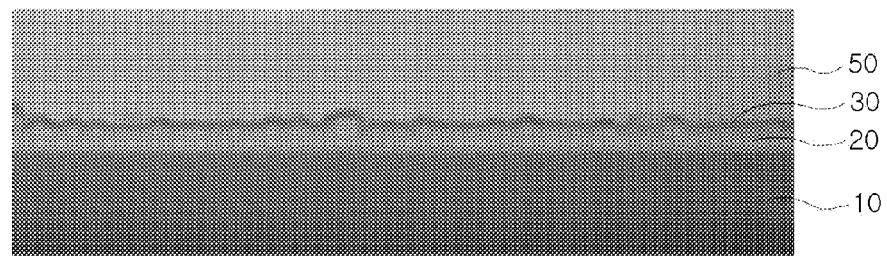
FIG. 4 is an electron microscope photograph illustrating a section of an indium thin film, a diamond-like carbon thin film, and a protective layer that are deposited on an initial silicon substrate, in the method of manufacturing a nanowire according to the embodiment of the present invention.
Figure 5:
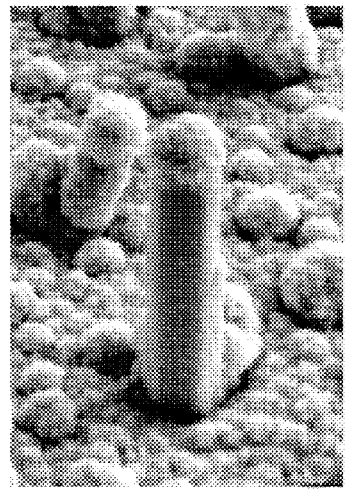
FIG. 5 is an electron microscope photograph illustrating the In nanowire according to the embodiment of the present invention.
Figure 6A:
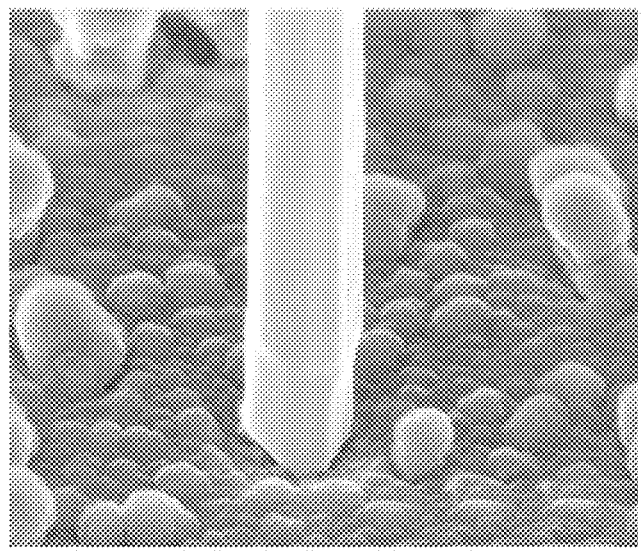
FIGS. 6A and 6B are electron microscope photographs illustrating section images of the In nanowire according to embodiments of the present invention.
Figure 6B:
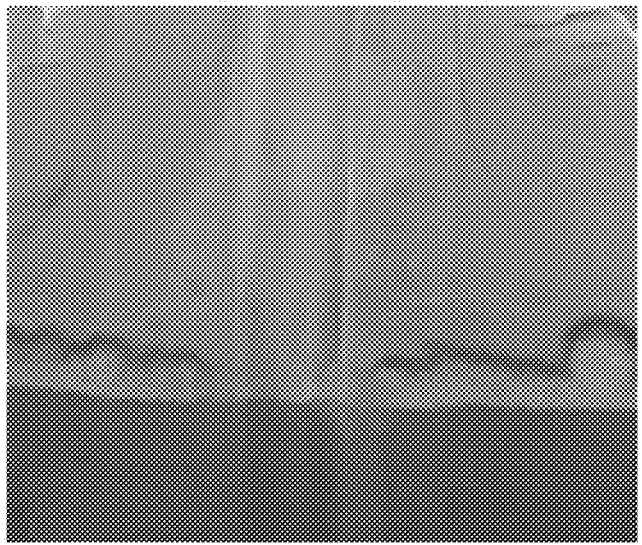

FIGS. 4 and 5 are electron microscope photographs illustrating the In nanowire according to the embodiment of the present invention.

Figure 1F:
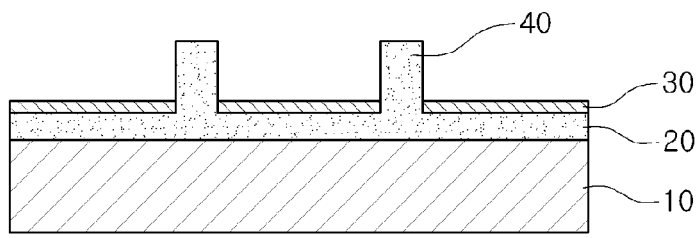
Figure 1G:
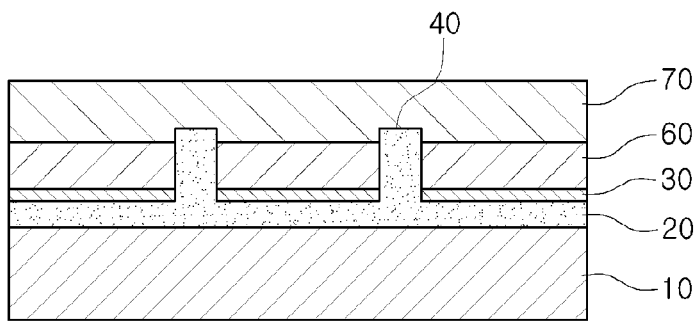

Next, referring to FIGS. 1F, 4, and 5, the In nanowire 40 may be grown by heat treating the patterned substrate 10 within a chamber (not illustrated) under the conditions of, for example, a radio frequency (RF: ultrahigh frequency band) power of 10 W and an atmospheric pressure of $5 \times 10^{-3}$ torr, but the heat treatment conditions of the present invention are not limited thereto.

That is, the In nanowire 40 may be grown so as to be vertically protruded through drawing the indium (In) of the indium thin film 20 to the outside through the through hole 31 due to the difference in the thermal expansion coefficients between the indium thin film 20, the substrate 10 disposed beneath the indium thin film 20, and the insulating film 30 disposed on the indium thin film 20.

Figure 7A:
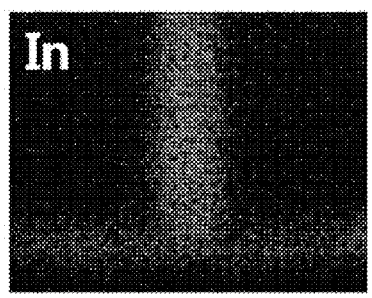
FIGS. 7A to 7D are electron microscope photographs illustrating results of chemically analyzing sections of the In nanowire according to the embodiment of the present invention.
Figure 7B:
Figure 7C:
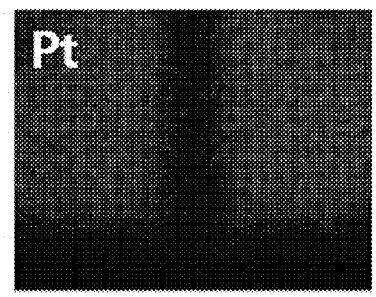
Figure 7D:
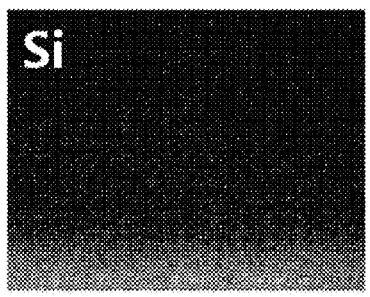

FIGS. 7A to 7D illustrate a thin film structure after the heat treatment process according to the embodiment of the present invention, and when viewed from the electron microscope photographs illustrated, the growth of indium is clearly observed in FIG. 7A, while in case of carbon of FIG. 7B, platinum of FIG. 7C, and silicon of FIG. 7D, the shapes are dimly shown. Thus, it can be confirmed that the In nanowire 40 may be formed properly by the heat treatment process according to the embodiment of the present invention.

Figure 8:
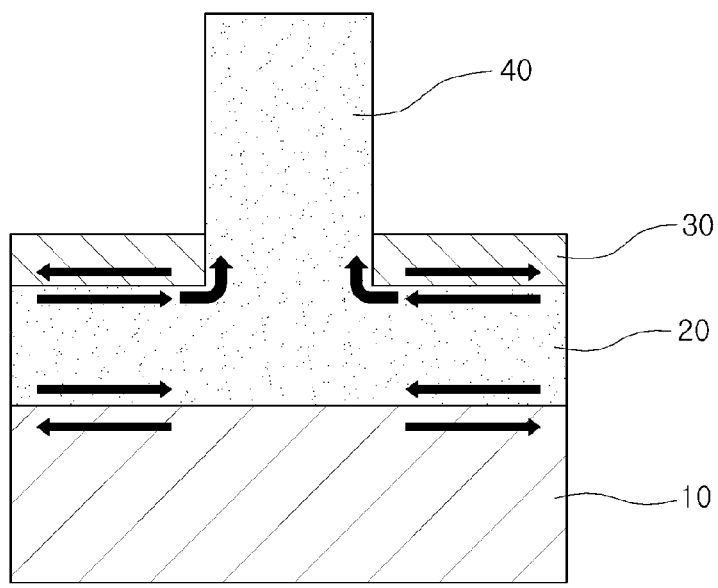
FIG. 8 is a cross-sectional view for describing a growth principle of the In nanowire according to the embodiment of the present invention.

Referring to FIG. 8, a principle of generating an In nanowire according to the embodiment of the present invention can be well understood.

The thermal expansion coefficient of indium forming the indium thin film 20 is about 33 ppm/° C., the thermal expansion coefficient of silicon forming the substrate 10 is about 4.68 ppm/° C., and the thermal expansion coefficient of diamond-like carbon forming the insulating film 30 is about 2.3 ppm/° C. That is, the thermal expansion coefficient of the indium thin film 20 is relatively higher than that of the silicon substrate 10 and the insulating film 30 formed of the diamond-like carbon.

Therefore, when the heat treatment is performed in the thin film structure in which the plurality of through holes 31 are patterned in the insulating film 30, the indium thin film 20 may be further expanded than the substrates 10 formed of silicon and the insulating film 30 formed of diamond-like carbon respectively formed upper lower parts thereof.

However, the plurality of In nanowires 40 are grown by applying the compression stress to the indium thin film 20 between the substrate 10 and the insulating film 30 that have a relatively small thermal expansion coefficient and by being vertically protruded through drawing the indium (In) component of the indium thin film 20 to the outside through the respective through holes 31 formed in the insulating film 30.

To the contrary, when cooling is performed, the In nanowire 40 is subjected to a tensile stress by force against a shrinkage property due to an opposite phenomenon thereto.

Therefore, when the In nanowire 40 is grown to a predetermined height, the heat treatment stops and the cooling is performed to end the growth of the In nanowire 40, such that the manufacturing of the In nanowire 40 having a predetermined height is completed.

The manufactured In nanowire 40 may be obtained by a pre-patterning process and a post-heat treatment process to accurately set positions in which respective In nanowires 40 are grown, such that the In nanowire 40 may be used for a relatively large area substrate.

Meanwhile, the In nanowire 40 formed as described above may further be subjected to the nitrogen (N) plasma treatment, as necessary.

When the nitrogen plasma treatment is further performed, the grown indium (In) nanowire may be modified to indium nitride (InN).

Therefore, the nanowire device of indium nitride may be used for various kinds of light emitting devices as a semiconductor nanowire and may be applied to a display.

As an example of the device, a field effect transistor (FET), a sensor, a photo detector, a light emitting diode, a laser diode, an electroluminescence (EL) device, a photoluminescence (PL) device, a cathodeluminescence (CL) device, and the like may be used, but the present invention is not limited thereto.

As set forth above, according to the embodiments of the present invention, the In nanowire may be manufactured by the sputtering deposition, patterning and heat treatment processes as a top-down approach to manufacture the In nanowire more simply and rapidly than the existing process.

While the present invention has been shown and described in connection with the embodiments, it will be apparent to those skilled in the art that modifications and variations can be made without departing from the spirit and scope of the invention as defined by the appended claims.

What is claimed is:

1. An Indium (In) nanowire, comprising:
a substrate;
an indium thin film formed on the substrate;
an insulating film formed on the indium thin film and having at least one through hole through formation of a pattern; and
an In nanowire vertically protruded from the indium thin film through the at least one through hole,
wherein the insulating film is formed of diamond-like carbon.

2. The In nanowire of claim 1, wherein a thermal expansion coefficient of the indium thin film is higher than that of the substrate and the insulating film.

3. The In nanowire of claim 1, wherein the indium thin film has a thermal expansion coefficient of $2.5 \times 10^{-6}/°C.$ through $3.3 \times 10^{-6}/°C.$, the substrate has a thermal expansion coefficient of $3.2 \times 10^{-6}/°C.$ through $8.5 \times 10^{-6}/°C.$, and the insulating film is formed of carbon having a thermal expansion coefficient of $3.0 \times 10^{-6}/°C.$ through $6.5 \times 10^{-6}/°C.$ 4. The In nanowire of claim 1, wherein a thickness of the indium thin film is 200 to 400 nm.

5. The In nanowire of claim 1, wherein the substrate is formed of a silicon or glass substrate.

6. An In nanowire device, comprising:
a substrate;
an indium thin film formed on the substrate;
an insulating film formed on the indium thin film and having at least one through hole through formation of a pattern;
an In nanowire vertically protruded from the indium thin film through the at least one through hole; and
an electrode layer formed on the In nanowire
wherein the insulating film is formed of diamond-like carbon.

7. The In nanowire device of claim 6, wherein a thermal expansion coefficient of the indium thin film is higher than that of the substrate and the insulating film.

8. The In nanowire device of claim 6, wherein the indium thin film has a thermal expansion coefficient of $2.5 \times 10^{-6}/°C.$ through $3.3 \times 10^{-6}/°C.$, the substrate has a thermal expansion coefficient of $3.2 \times 10^{-6}/°C.$ through $8.5 \times 10^{-6}/°C.$, and the insulating film is formed of carbon having a thermal expansion coefficient of $3.0 \times 10^{-6}/°C.$ through $6.5 \times 10^{-6}/°C.$ 9. The In nanowire device of claim 6, wherein a thickness of the indium thin film is 200 to 400 nm.

10. The In nanowire device of claim 6, wherein the substrate is configured of a silicon or glass substrate.

11. The In nanowire device of claim 6, wherein the In nanowires include a filler provided therebetween, the filler being formed of an insulating material.

12. The In nanowire device of claim 6, wherein the device is a light emitting device for a field effect transistor (FET).

13. A method of manufacturing an In nanowire, comprising:
forming an indium thin film by depositing the indium thin film on a substrate using sputtering equipment;
forming an insulating film on the indium thin film and forming at least one through hole in the insulating film so as to expose the indium thin film by patterning; and
growing an In nanowire by heat treating the patterned substrate so as to be vertically protruded from the indium thin film through the at least one through hole,
wherein in the forming of the insulating film, the insulating film is formed by depositing diamond-like carbon on the indium thin film.

14. The method of claim 13, wherein in the forming of the indium thin film, the indium thin film having a thermal expansion coefficient higher than that of the substrate is deposited on the substrate by the sputtering equipment to form the indium thin film; in the forming of the insulating film, a material having a thermal expansion coefficient lower than that of the indium thin film is deposited on the indium thin film to form the insulating film; and in the growing of the In nanowire, the In nanowire is vertically protruded from the indium thin film through the at least one through hole by a difference in the thermal expansion coefficients between the indium thin film, the substrate, and the insulating film during the heat treatment of the substrate.

15. The method of claim 13, wherein the substrate is a silicon or glass substrate having a thermal expansion coefficient of $3.2 \times 10^{-6}/°C.$ through $8.5 \times 10^{-6}/°C.$, the indium thin film is formed by depositing indium having a thermal expansion coefficient of $2.5 \times 10^{-6}/°C.$ through $3.3 \times 10^{-6}/°C.$ on the substrate, and the insulating film is formed by depositing carbon having a thermal expansion coefficient of $3.0 \times 10^{-6}/°C.$ through $6.5 \times 10^{-6}/°C.$ on the indium thin film.

16. The method of claim 13, wherein in the forming of the indium thin film, the indium thin film is formed on the substrate by depositing indium so that a thickness of the indium thin film is 200 to 400 nm.

17. The method of claim 13, further comprising:
forming a protective layer formed of platinum (Pt) on the insulating film after the insulating film is formed, performing patterning, and removing the protective layer formed on the insulating film so as to expose the insulating film.

18. The method of claim 13, wherein in the forming of the insulating film, the insulating film is formed by being partially polished by a focused ion beam so as to have a pattern a plurality of through holes.

19. The method of claim 13, wherein the patterned substrate is heat treated within a vacuum chamber.

20. The method of claim 13, further comprising, after the growing of the In nanowire, performing a plasma treatment on the In nanowire.

* * * * *